(12) United States Patent
Mishra et al.

(10) Patent No.: US 10,084,093 B1
(45) Date of Patent: Sep. 25, 2018

(54) LOW RESISTANCE CONDUCTIVE CONTACTS

(71) Applicant: GLOBALFOUNDRIES INC., Grand Cayman (KY)

(72) Inventors: Shiv Kumar Mishra, Mechanicville, NY (US); Sunil Kumar Singh, Mechanicville, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/600,872

(22) Filed: May 22, 2017

(51) Int. Cl.
| H01L 21/00 | (2006.01) |
| H01L 29/78 | (2006.01) |
| H01L 23/532 | (2006.01) |
| H01L 29/66 | (2006.01) |
| H01L 29/49 | (2006.01) |

(52) U.S. Cl.
CPC ...... *H01L 29/785* (2013.01); *H01L 23/53252* (2013.01); *H01L 29/4975* (2013.01); *H01L 29/6656* (2013.01); *H01L 29/66795* (2013.01)

(58) Field of Classification Search
CPC ............... H01L 29/785; H01L 29/4975; H01L 29/6656
See application file for complete search history.

(56) References Cited

U.S. PATENT DOCUMENTS

| 8,357,978 | B1* | 1/2013 | Baars ................. H01L 29/4966 257/288 |
| 8,383,500 | B2* | 2/2013 | Marxsen ......... H01L 21/823807 438/230 |
| 9,171,935 | B2* | 10/2015 | Kim .................. H01L 29/66795 |
| 9,196,712 | B1* | 11/2015 | Hasanuzzaman ....... H01L 21/84 |
| 9,299,616 | B1* | 3/2016 | Faul ................ H01L 21/823437 |
| 9,331,159 | B1* | 5/2016 | Jha .................... H01L 29/41783 |
| 9,362,383 | B1* | 6/2016 | Balakrishnan ...... H01L 29/6653 |
| 9,502,408 | B2* | 11/2016 | Kerber ............ H01L 21/823431 |
| 9,508,848 | B1* | 11/2016 | Akarvardar ....... H01L 29/66795 |
| 9,620,644 | B2* | 4/2017 | Basker .................. H01L 29/785 |
| 9,653,464 | B1* | 5/2017 | Leobandung ....... H01L 27/0886 |
| 9,887,094 | B1* | 2/2018 | Qi ..................... H01L 29/66795 |
| 2009/0091038 | A1 | 4/2009 | Chen et al. |
| 2011/0266638 | A1* | 11/2011 | Frohberg .......... H01L 21/28518 257/412 |
| 2013/0248985 | A1* | 9/2013 | Amarnath ......... H01L 29/66545 257/330 |
| 2014/0264641 | A1* | 9/2014 | Frohberg ............ H01L 29/4175 257/412 |
| 2016/0133727 | A1* | 5/2016 | Hashemi ........... H01L 29/66795 257/288 |
| 2017/0062601 | A1* | 3/2017 | Basker ............. H01L 29/66636 |
| 2017/0117373 | A1* | 4/2017 | Ando ................ H01L 29/42356 |
| 2017/0287777 | A1* | 10/2017 | Patil ................. H01L 21/76879 |
| 2018/0026118 | A1* | 1/2018 | Breil ................ H01L 29/66795 |

(Continued)

*Primary Examiner* — Laura Menz
(74) *Attorney, Agent, or Firm* — Scully, Scott, Murphy & Presser; Frank Digiglio

(57) ABSTRACT

During formation of a trench silicide contact, a sacrificial layer is incorporated into the trench directly over source/drain junctions prior to metallization of the trench. Selective removal of the sacrificial layer widens the trench proximate to the source/drain junctions, increasing the contact area and correspondingly decreasing the contact resistance between the source/drain junctions and a silicide layer.

10 Claims, 6 Drawing Sheets

(56) References Cited

U.S. PATENT DOCUMENTS

| | | | |
|---|---|---|---|
| 2018/0076226 A1* | 3/2018 | Leobandung | H01L 27/1211 |
| 2018/0083045 A1* | 3/2018 | Leobandung | H01L 27/1211 |
| 2018/0108654 A1* | 4/2018 | Ontalus | H01L 27/0886 |

* cited by examiner

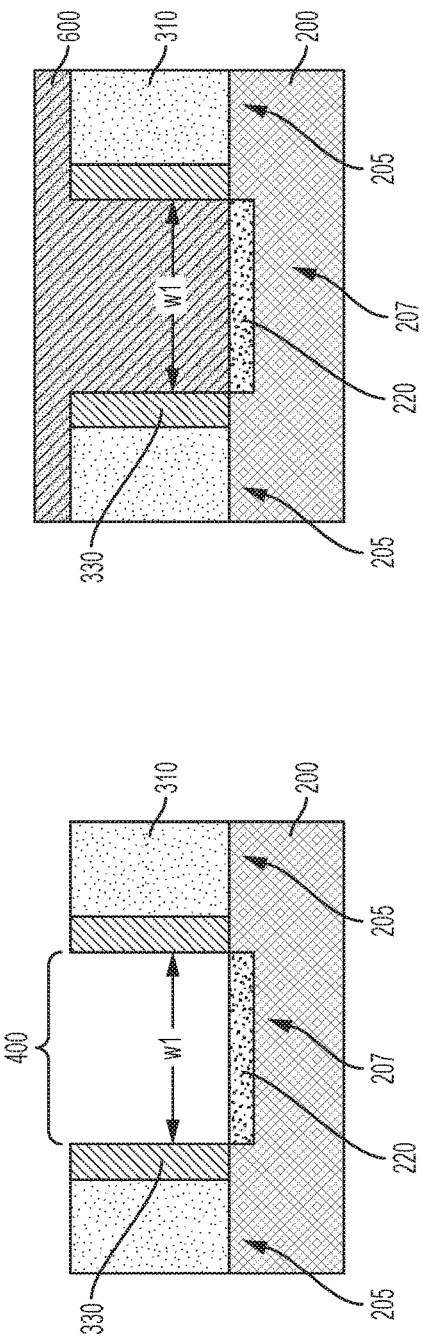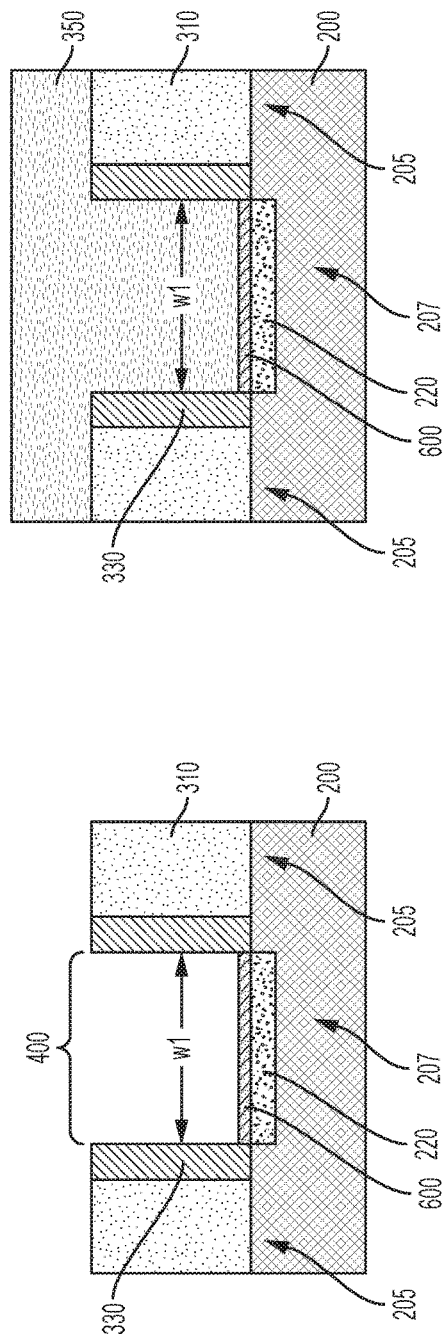

LOW RESISTANCE CONDUCTIVE CONTACTS

BACKGROUND

The present application relates generally semiconductor devices, and more specifically to low resistance conductive contacts and their methods of production.

Advances in integrated circuit (IC) materials and design have yielded generations of ICs where successive generations have smaller and more complex circuits. As ICs evolve, the functional density (i.e.; the number of interconnected devices per unit area) has generally increased and the critical dimension (i.e., the minimum feature size) has decreased. While dimensional scaling improves performance, increases production efficiency, and lowers costs, it has also increased the complexity of processing and manufacturing.

SUMMARY

Notwithstanding recent developments, there is a need for improved methods of semiconductor device manufacture and feature patterning. The present disclosure relates to conductive contacts and their methods of manufacture, and specifically to metal semiconductor alloy conductive contacts that exhibit a decreased contact resistance.

Metal semiconductor alloy contacts may be used within semiconductor devices to provide electrical connection between conductive elements. An exemplary semiconductor device is a fin field effect transistor (FinFET) wherein an output current, i.e., a source-drain current, is controlled by a voltage that is applied to a gate. Such a device typically has three terminals, i.e., conductive connections to each of the gate, source, and drain regions of the device.

The gate is used to control the output current, i.e., the flow of carriers through a channel region of the device by the application of an electrical or magnetic field. The channel is a semiconductor region between the source and the drain that becomes conductive when an electric or magnetic bias is applied to the gate, i.e., the device is turned on. During operation, majority carriers flow into the channel from the source and flow out of the channel into the drain. The source and drain regions are commonly doped regions.

Conductive contacts such as metal semiconductor alloy contacts are typically made to the source and drain regions of the device. The contacts are usually formed in a trench, i.e., an opening, which extends through an overlying dielectric layer. An opening through the dielectric layer is also provided to make contact to the gate.

It has been shown that decreasing the lateral dimensions of the openings for the conductive contacts results in an increase in the contact resistance. More specifically, as the lateral dimensions of the trenches are decreased, the contact area between the conductive contacts and the respective source and drain regions of the device also decreases, which adversely affects the conduction between the structures.

Thus, according to various embodiments, and as shown in FIG. 1, a contact opening (e.g., trench) is provided where a lateral dimension of the opening at the bottom of the trench, i.e., proximate to a source/drain junction, is larger than the lateral dimension at the top of the trench, thereby increasing the contact area within the trench between the conductive contact and the source/drain junction without increasing the overall footprint of the contact architecture or altering the design rules for the device.

In the exemplary FinFET device of FIG. 1 a semiconductor fin 200 includes a raised source/drain junction 220 formed over a source/drain region 207 of the fin. Channel regions 205 of the fin 200 are laterally spaced from the source/drain region 207, i.e., along a length of the fin, and a functional gate stack 300 including a gate dielectric and a gate conductor (not separately shown) is disposed over respective channel regions 205. Sidewall spacers 330 are located on sidewalls of the gate stacks 300, and are configured to isolate the gate stacks 300 from a trench 400 that extends through interlayer dielectric (ILD) 500 to the source/drain junction 220. Within the trench 400, a metallization architecture includes a self-aligned metal semiconductor alloy contact 410 disposed directly over the source/drain junction 220 and a conductive fill layer 420 disposed over the metal semiconductor alloy contact 410. A dielectric layer 350 such as a layer of low temperature oxide (LTO) is disposed between the conductive fill layer 420 and the sidewall spacers 330, and over the metal semiconductor alloy contact 410.

During the manufacture of such a device, a sacrificial layer is incorporated into the trench architecture directly over the source/drain junction 220 prior to metallization of the trench. Selective removal of the sacrificial layer widens the trench proximate to the source/drain junction 220, thus increasing the contact area and decreasing the contact resistance between respective source/drain junctions and the later-formed trench metallization. In particular embodiments, the trench metallization includes a self-aligned silicide, i.e., salicide layer.

In accordance with embodiments of the present application, a method of forming a semiconductor device includes forming an opening through a first dielectric layer to an exposed surface of a semiconductor substrate and forming a source/drain junction on the exposed surface. A sacrificial layer is deposited within the opening and directly over the source/drain junction, and a second dielectric layer is then deposited within the opening and over the sacrificial layer. The method further includes forming an opening through the second dielectric layer and the sacrificial layer to expose a portion of the source/drain junction and remove remaining portions of the sacrificial layer from under the second dielectric layer. A metal layer is then deposited beneath the second dielectric layer and directly over the source/drain junction. An annealing step may be used to react the metal layer with the source/drain junction and form a metal semiconductor alloy contact, where at least a portion of the metal semiconductor alloy contact underlies the second dielectric layer.

According to further embodiments, a semiconductor device includes a semiconductor fin disposed over a semiconductor substrate and a source/drain junction formed over a source/drain region of the fin. A conductive contact that includes a metal semiconductor alloy layer and a conductive fill layer is in electrical contact with the source/drain junction. The metal semiconductor alloy layer has a first width and the conductive till layer has a second width less than the first width.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2 is a schematic cross-sectional diagram showing the deposition of sidewall spacers within a trench and adjacent to an epitaxial source/drain junction formed over a semiconductor fin;

FIG. 3 shows the deposition of a sacrificial layer within the trench;

FIG. 4 depicts the structure of FIG. 3 following a recess etch of the sacrificial layer;

FIG. 5 shows backfilling of the trench with a layer of low temperature oxide (LTO);

DETAILED DESCRIPTION

Figure 1:
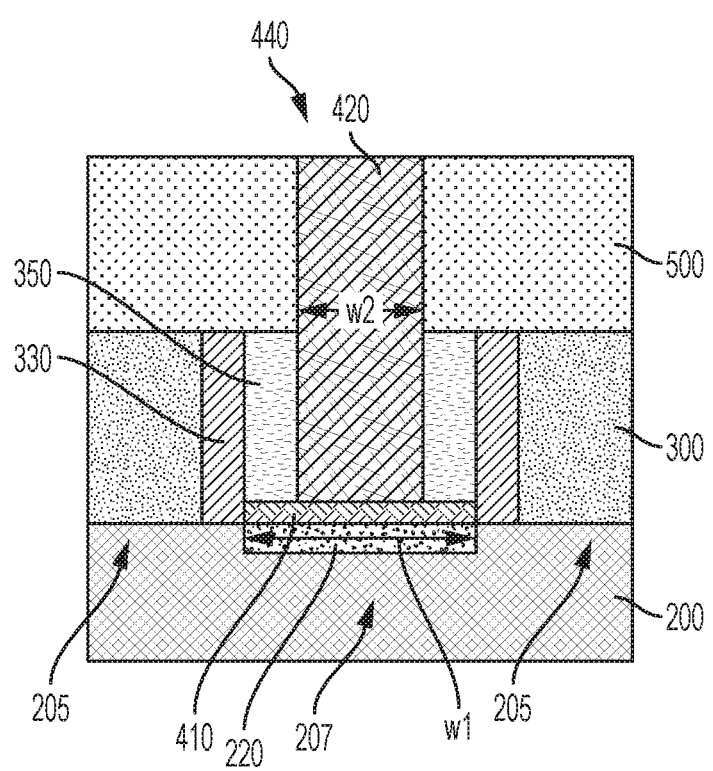
FIG. 1 is a schematic cross-sectional diagram of a semiconductor device showing a trench silicide contact having enhanced contact area with an underlying source/drain junction according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is typically replaced by a functional gate after device activation, i.e., after dopant implantation into source/drain regions of the fins and an associated drive-in anneal, in order to avoid exposing the functional gate materials to the thermal budget associated with activation.

A "functional gate" refers to a structure used to control output current (i.e., the flow of carriers through a channel) of a semiconductor device using an electrical field or, in some instances, a magnetic field. A functional gate typically includes a gate dielectric disposed directly over the channel region and gate conductor disposed over the gate dielectric.

Electrical contact to the gate as well as to the source and drain regions of the fins is typically made within trenches that extend through an overlying layer of dielectric material. Methods of defining the trenches and methods of forming trench metallization layers that provide high conductivity contacts are described herein with particular reference to FIGS. 2-14.

Referring to FIG. 2, shown in a schematic cross-sectional view of a portion of a FinFET device at an intermediate stage of fabrication. A semiconductor fin 200 is formed over a semiconductor substrate (not shown). The substrate may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof.

The substrate is not limited to silicon-containing materials, however, as the substrate may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

According to various embodiments, the substrate may be a bulk substrate or a composite substrate such as a semiconductor-on-insulator (SOI) substrate that comprises, from bottom to top, a handle portion, an isolation layer, and a semiconductor material layer.

In various embodiments, plural fins 200 are arrayed over the semiconductor substrate, and may be formed by patterning and then etching the substrate, i.e., a top portion of the substrate. The fins 200 comprise a semiconductor material such as silicon, and in several embodiments are etched from, and are therefore are contiguous with the semiconductor substrate. For instance, fins 200 may be formed using a sidewall image transfer (SIT) process as known to those skilled in the art.

In embodiments, the fins 200 can have a width of 5 nm to 20 nm, a height of 40 nm to 150 nm, and a pitch of 20 nm to 100 nm, although other dimensions are also contemplated. Parallel fins 200 may be arrayed on the substrate at a regular intrafin spacing or pitch. As used herein, the term "pitch" refers to the sum of the fin width and the spacing between neighboring fins. In example embodiments, the fin pitch may be within a range of 20 to 100 nm, e.g., 20, 30, 40, 50, 60, 70, 80, 90 or 100 nm, including ranges between any of the foregoing values, although smaller and larger pitch values may be used.

Referring still to FIG. 2, a sacrificial gate 310 is disposed over each channel region 205 of fin 200. A layer of sacrificial gate material(s) including, for example, polysilicon, may be conformally deposited over the sidewalls and top surface of each fin 200. The sacrificial gate 310 may be formed by photolithographic patterning and etching processes as known to those skilled in the art.

In the illustrated embodiment, spacer layers 330 are formed over sidewalls of the sacrificial gates 310. By way of example, spacer formation may include a conformal deposition process such as chemical vapor deposition (CVD), followed by an anisotropic etch to remove the spacer material(s) from horizontal surfaces. The spacer layers 330 may comprise a dielectric material such as silicon nitride. A thickness of the spacer layers 330 may range from 5 to 10 nm, for example.

According to various embodiments, the formation or deposition of a layer or structure, including the foregoing layers, may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

A source/drain region 207 of the fin 200 is exposed between the spacer layers 330 within trench 400, and a source/drain junction 220 is formed over the source/drain region. A source/drain junction 220 may be formed on exposed surfaces of the fin 200 by selective epitaxy or by ion implantation at self-aligning locations with the spacers layers 330 between the sacrificial gates 310. The source/drain junctions 220 may include dopants that are incorporated in situ during the epitaxial growth process, or implanted in the source/drain regions. Between opposing spacer layers 330, trench 400 may have a lateral dimension, i.e., a width, equal to w1. As used herein, a "lateral" dimension is measured in a direction parallel to a major surface of the substrate.

Following formation of source/drain junctions 220, a sacrificial layer 600 is deposited over the fins to fill trench 400, as shown in FIG. 3. The sacrificial layer 600 may include a thermally decomposable material, a photonically decomposable material, an e-beam decomposable material, as well as combinations or multilayers thereof. In certain embodiments, the sacrificial layer 600 may be an organic compound (e.g., $C_xH_y$). In alternate embodiments, the sacrificial layer 600 may be an inorganic compound such as a silicon-containing $C_xH_y$ compound. The sacrificial layer 600 may be formed by chemical vapor deposition (CVD).

Referring to FIG. 4, the sacrificial layer 600 can be etched and recessed within the trench 400 using an isotropic or an anisotropic etching process to expose upper sidewall surfaces of the spacer layers 330 within the trench 400. In embodiments, a dry etching process such as reactive ion etching can be used. In other embodiments, a wet chemical etchant can be used. In still further embodiments, a combination of dry etching and wet etching can be used. Following the recess etch, the sacrificial layer thickness may be 5 to 20 nm, e.g., 5, 10, 15 or 20 nm, including ranges between any of the foregoing values.

Referring to FIG. 5, the trench 400 is then backfilled with a layer of low temperature oxide (LTO) 350. A low temperature oxide layer 350 may be formed by chemical vapor deposition (CVD) at a temperature of less than 300° C. using, for example, a silicon-containing precursor such as $SiH_4$, and an oxidizing gas such as $O_2$ or $N_2O$.

Figure 6:
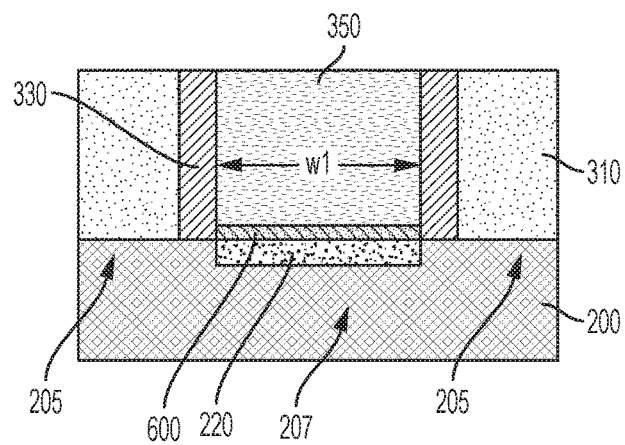
FIG. 6 shows the structure of FIG. 5 after a planarization step.

The low temperature oxide 350 may be self-planarizing, or the top surface of the LTO layer 350 can be planarized, for example, by chemical mechanical polishing (CMP) as illustrated in FIG. 6. Chemical mechanical polishing (CMP) is a material removal process that uses both chemical reactions and mechanical forces to remove material and planarize a surface. Sacrificial gate 310 may function as a CMP etch stop during planarization of the LTO layer 350.

Following the CMP step, a replacement metal gate (RMG) module may be used to replace the sacrificial gate 310 with a functional gate 300. In such a process, the sacrificial gate 310 is selectively removed, and a functional gate 300 is formed in the location where the sacrificial gate used to be. Sacrificial gate 310 may be removed using wet chemical etching or dry etching. As noted above, the sacrificial gate 310 may be formed from polysilicon. In that case, the sacrificial gate 310 can be removed using a silicon-specific RIE process.

As known to those skilled in the art, the functional gate architecture 300 includes a gate dielectric and a gate conductor (not separately shown). A gate dielectric layer may be formed by thermal oxidation, typically at 750-800° C., or alternatively, may be formed by depositing a conformal dielectric layer. The terms "conformal layer" and "conformally deposited layer" denote a layer having a thickness that deviates by no more than 20% (e.g., less than 5, 10 or 20%) from an average thickness of the layer. According to certain embodiments, the gate dielectric layer may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

As will be appreciated, the compounds silicon nitride and silicon dioxide have compositions that are nominally represented as $Si_3N_4$ and $SiO_2$, respectively. The terms silicon nitride and silicon dioxide, refer to not only these stoichiometric compositions, but also to nitride and oxide compositions that deviate from the stoichiometric compositions.

The gate dielectric may be deposited directly onto channel regions 205 of the fins by a suitable process such as atomic layer deposition (ALD), chemical vapor deposition (CVD), physical vapor deposition (PVD), thermal oxidation, UV-ozone oxidation, or combinations thereof. In various embodiments, the gate dielectric thickness may range from 1 nm to 10 nm, e.g., 1, 2, 4, 6, 8 or 10 nm, including ranges between any of the foregoing values, and may include, for example, a thin layer (e.g., 0.5 nm) of silicon dioxide and an overlying layer of high-k dielectric material.

A gate conductor, i.e., a gate electrode, is formed over the gate dielectric layer(s). The gate electrode may include a conductive material such as polysilicon, although amorphous silicon, a combination of amorphous silicon and polysilicon, polysilicon-germanium, or any other appropriate material may be used. When the gate electrode layer is a silicon material, it may be deposited as a doped layer (in situ doping).

In addition, in some embodiments, it might be advantageous to employ a metal gate conductor layer, such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, and other conductive metal compounds such as TiN, TiC, TiSiN, TiTaN, TaN, TaAlN, TaSiN, TaRuN, WSiN, NiSi, CoSi, as well as combinations thereof.

The gate electrode may comprise one or more layers of such materials such as, for example, a metal stack including a work function metal layer and/or a liner. In various embodiments, the thickness of the work function metal layer is 3 to 5 nm. The gate electrode may be a conformal layer that is formed over exposed surfaces of the structure and then selectively removed to define the desired geometry.

The gate electrode can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

Figure 7:
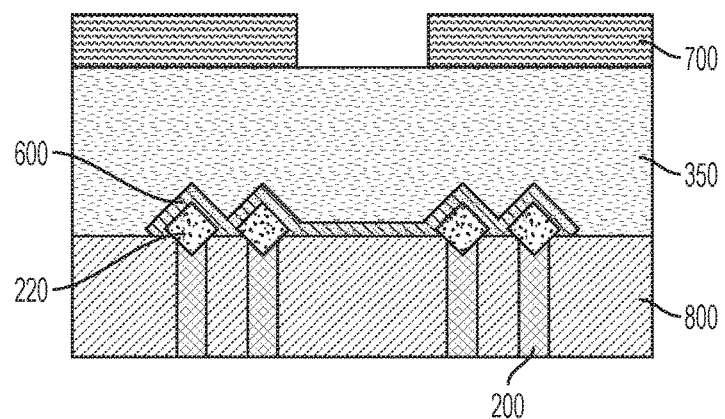
FIG. 7 is a schematic cross-sectional view of the device structure taken orthogonal to the views of FIGS. 1-6 showing patterning of the LTO layer between adjacent pairs of fins.

Referring to FIG. 7, a cross-sectional view of the device following the RMG module is taken orthogonal to the views of FIGS. 1-6, i.e., parallel to a length direction of the fins 200, and shows the deposition and patterning of a layer of photoresist 700 over the LTO layer 350. The photoresist 700 may include a positive-tone photoresist composition, a negative-tone photoresist composition, or a hybrid-tone photoresist composition. The layer of photoresist material may be formed by a deposition process such as, for example, spin-on coating.

According to various embodiments, the deposited photoresist layer is subjected to a pattern of irradiation, and the exposed photoresist material is developed utilizing a conventional resist developer. In the instant embodiment, this provides a patterned layer of photoresist over the LTO layer 350, as shown in FIG. 7.

Figure 8:
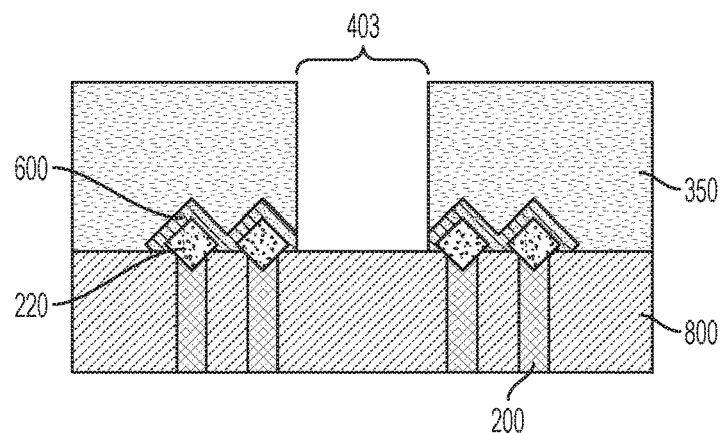
FIG. 8 shows etching of the low temperature oxide and the sacrificial layer to form an isolation trench.

The pattern provided by the patterned photoresist material is thereafter transferred into the LTO layer 350 and the sacrificial layer 600, and the photoresist is removed. The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used. FIG. 8 shows etching of the low temperature oxide layer 350 and the sacrificial layer 600 between adjacent pairs of fins 200 to form an isolation trench 403.

Figure 9:
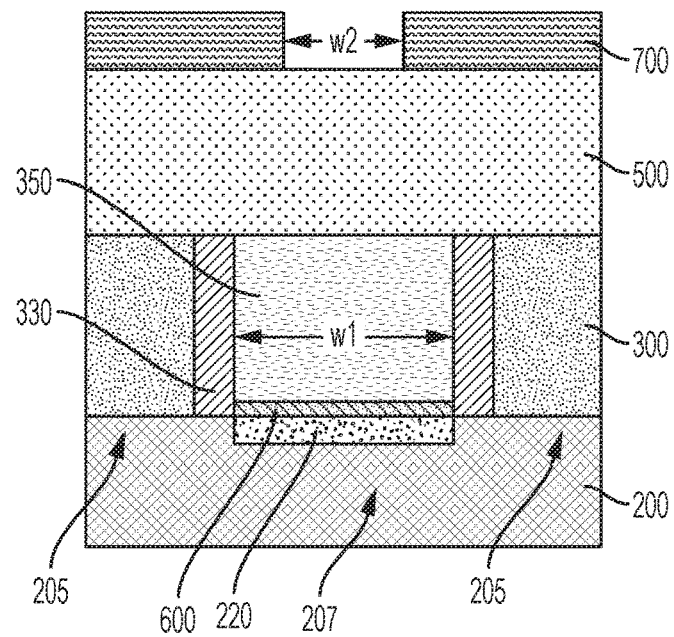
FIG. 9 shows the deposition of an isolation oxide layer and the patterning of a layer of photoresist over the isolation oxide layer.
Figure 10:
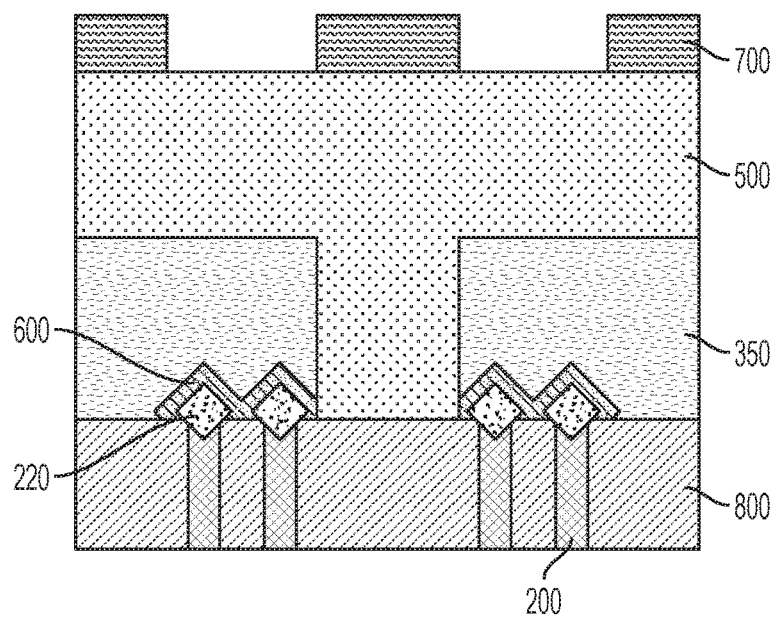
FIG. 10 show the deposition of the isolation oxide layer within the isolation trench and the patterning of the photoresist layer over the isolation oxide.

Referring to FIGS. 9 and 10, a layer of silicon dioxide (SiO$_2$) 500 is deposited over the structure and into isolation trench 403 and a further layer of photoresist 700 is deposited over the silicon dioxide layer 500 and patterned. FIG. 10 is a transverse view of the structure of FIG. 9 and shows the formation of the isolation oxide 500 layer within the isolation trench 403 and between neighboring pairs of fins. The silicon dioxide layer 500 may be formed using a TEOS-based CVD or spin-on process as known to those skilled in the art, and is configured to electrically isolate adjacent trench metallization structures.

Figure 11:
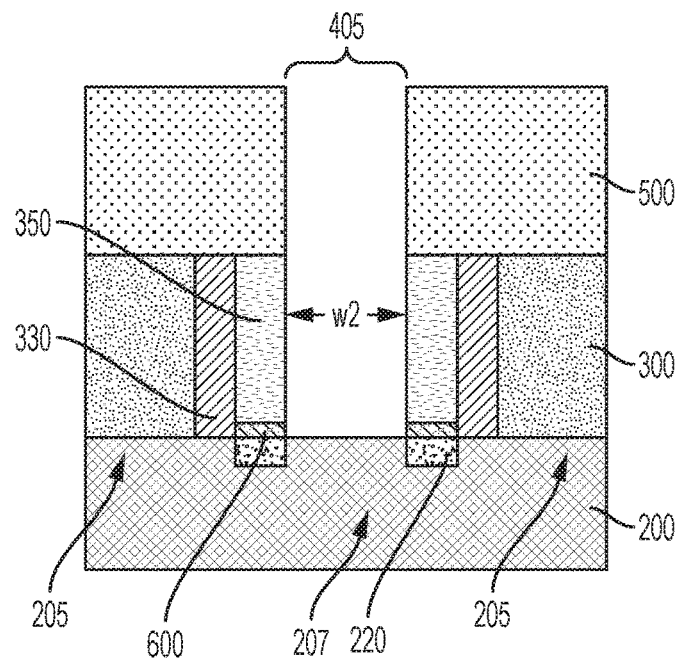
FIG. 11 depicts an anisotropic etch of the low temperature oxide and the sacrificial layer using the isolation oxide layer as an etch mask.

Thereafter, referring to FIG. 11, using the photoresist layer 700 as an etch mask, a further trench 405 is formed extending through the silicon dioxide layer 500, LTO layer 350, and sacrificial layer 600 to expose source/drain junction 220. The formation of trench 405 exposes the LTO layer 350 and the sacrificial layer 600 within the trench 405. Between opposing LTO layers 350, trench 405 may have a lateral dimension, i.e., width, that is equal to w2, where w2<w1. In various embodiments, the first width (w1) is at least 10% greater than the second width (w2), e.g., 10, 20, 30, 40, 50 or 100% greater, including ranges between any of the foregoing values.

Figure 12:
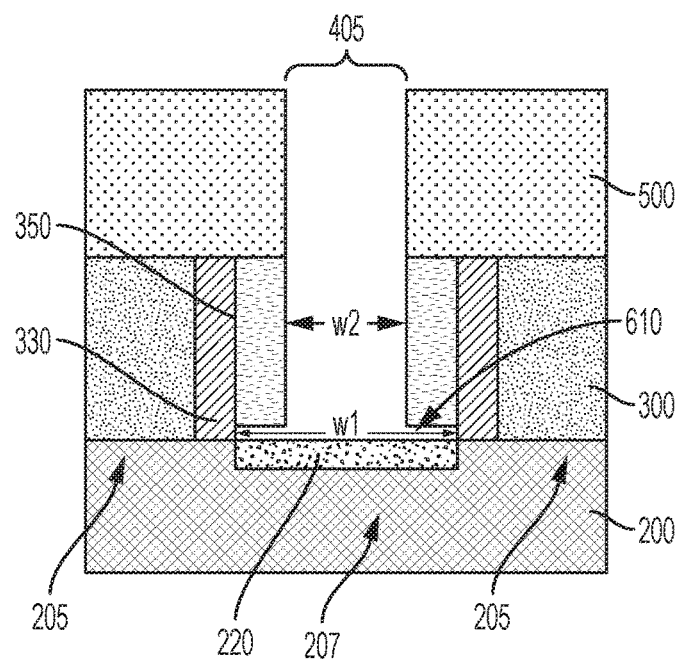
FIG. 12 shows the selective removal of the sacrificial layer from over the source/drain junction and from under remaining portions of the low temperature oxide.

Referring to FIG. 12, remaining portions of the sacrificial layer 600 may be removed selective to adjacent layers by exposure to a suitable energy source, such as thermal energy or electromagnetic radiation. In particular embodiments, the sacrificial layer 600 is removed selectively with respect to overlying LTO layer 350.

In various embodiments, thermal energy is used by heating to a temperature ranging from 100° C. to 500° C. for a duration of 1 to 30 min. In further embodiments, electromagnetic radiation with or without concomitant thermal heating may be used. For example, the sacrificial layer 600 may be removed by exposure to x-rays, ultraviolet (UV) radiation, visible light, infrared radiation and/or electron-beam (e-beam) radiation. Using radiation, the remaining portions of the sacrificial layer 600 underlying LTO layer 350 may be partially removed or entirely removed without adversely affecting source/drain junction 220.

Figure 13:
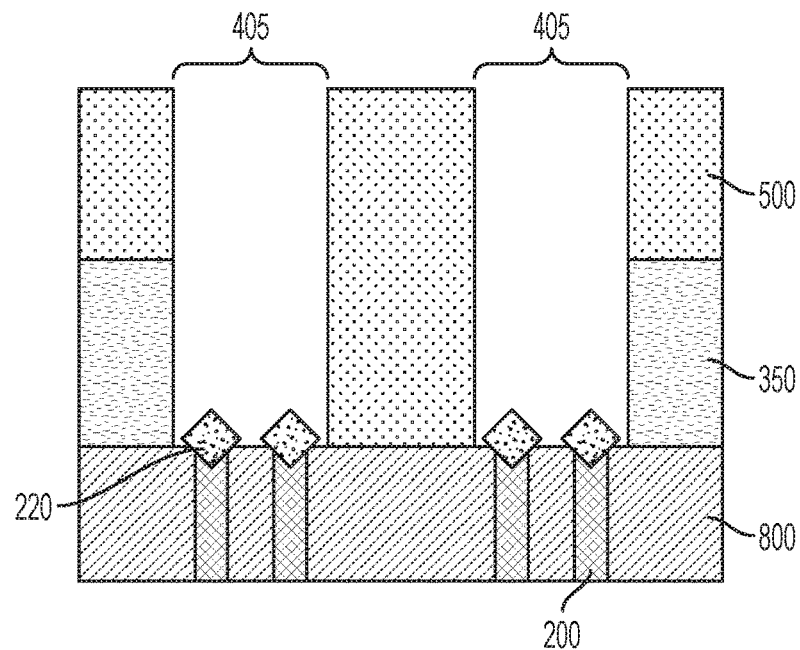
FIG. 13 shows etching of the isolation oxide layer, the low temperature oxide and the sacrificial layer to expose the source/drain junctions.

Removal of the sacrificial layer 600 results in the creation of gaps 610. The gaps 610 are formed between spacer layers 330, beneath remaining portions of the low temperature oxide layer 350, and directly over source/drain junction 220. Accordingly, the width of the trench 405 proximate to the gaps 610 may be w1, while the width of the trench 405 in regions above the gaps 601 is w2, where w1>w2. As seen in FIG. 12, the exposed area of the source/drain junction 220 is increased relative to the projected area of trench 405. FIG. 13 is a transverse view of the structure of FIG. 12 showing the exposed source/drain junctions 220 within neighboring trenches 405.

Referring again to FIG. 1, a post-metallization architecture is shown that includes a conductive contact structure 440 within trench 405. The conductive contact structure 440 includes a metal semiconductor alloy contact 410 in direct contact with the source/drain junction 220 and an overlying fill layer 420 that fills the trench 405. In the illustrated embodiment, conductive contact structure 440 completely fills trench 405, including gaps 610.

In various embodiments, the metal semiconductor alloy contact 410 may be formed in situ by a solid state reaction between a metal layer (not shown) and the source/drain junction 220. In various examples, the metal layer may comprise at least one of nickel, cobalt, tungsten, titanium, tantalum, aluminum, and platinum, as well as alloys thereof. The metal layer may be deposited to a thickness ranging from 5 nm to 20 nm. Following deposition of the metal layer, the structure is subjected to an annealing step including, but not limited to, rapid thermal annealing (RTA). During annealing, the metal layer reacts with the semiconductor material of the source/drain junction 220 to form the metal semiconductor alloy contact 410. As shown in FIG. 1, the metal semiconductor alloy contact 410 may have a width w1, while the fill layer 420 has a width w2.

In one embodiment, the thermal annealing includes heating to a temperature ranging from 350° C. to 600° C. for a time period ranging from 1 second to 90 seconds. Following the thermal anneal, the non-reacted portion of the metal layer may be removed, e.g., using an etch process that is selective to the metal layer.

As used herein a "metal semiconductor alloy" is an alloy of a metal (e.g., titanium) and a semiconductor material (e.g., silicon). An "alloy" of a metal and a semiconductor is homogeneous mixture or solid solution wherein metal atoms replace semiconductor atoms such as within a crystal lattice, or occupy interstitial positions between the semiconductor atoms. A layer of conductive material, such as tungsten, may be used to fill the trench before or after annealing to form the metal semiconductor alloy contact 410.

The layers of the conductive contact structure 440 may be deposited by chemical vapor deposition or physical vapor deposition processes, and then planarized using chemical mechanical polishing. Example PVD techniques include evaporation and sputtering. Exemplary sputtering systems include DC diode type systems, radio frequency (RF) sputtering, magnetron sputtering, and ionized metal plasma (IMP) sputtering.

Figure 14:
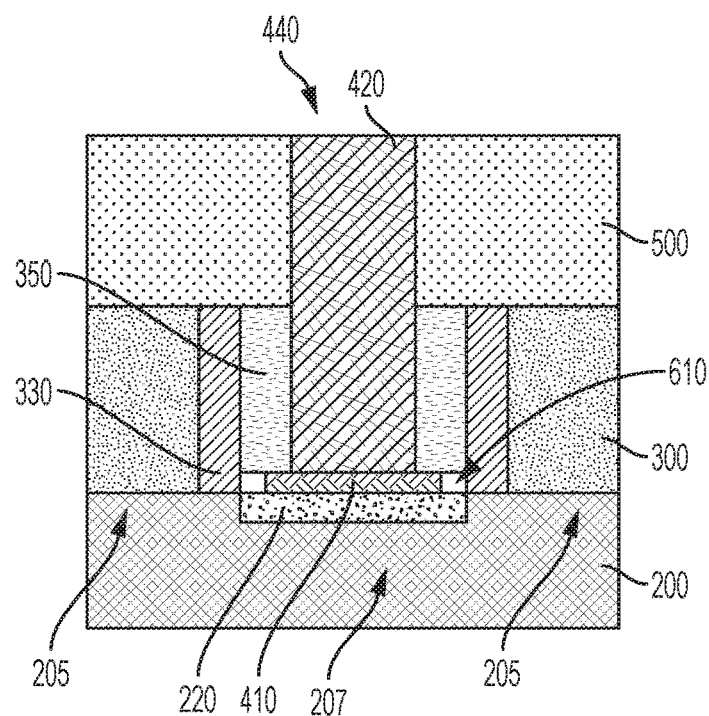
FIG. 14 is a schematic cross-sectional diagram of a semiconductor device according to various embodiments showing a trench silicide contact having enhanced contact area with an underlying source/drain junction and including an air gap.

Referring to FIG. 14, according to further embodiments, the metal layer may not entirely fill gaps 610, resulting in a metal semiconductor alloy contact 410 that underlies only a portion of the low temperature oxide layer 350, but is laterally separated from spacer layer 330 by gap 610. In such an example, the metal semiconductor alloy contact 410 may have a width (w), where w2<w<w1.

According to various embodiments, use of a sacrificial layer and its selective removal exposes a top surface of the source/drain junction 220 that creates an enlarged surface area onto which a metal layer can be deposited and reacted to form a metal semiconductor alloy contact 410.

As used herein, the singular forms "a," "an" and "the" include plural referents unless the context clearly dictates otherwise. Thus, for example, reference to a "contact" includes examples having two or more such "contacts" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a conductive fill layer that comprises tungsten include embodiments where a conductive fill layer consists essentially of tungsten and embodiments where a conductive fill layer consists of tungsten.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor device, comprising:
   forming an opening through a first dielectric layer to an exposed surface of a semiconductor substrate;
   forming a source/drain junction on the exposed surface;
   depositing a sacrificial layer within the opening and directly over the source/drain junction;
   depositing a second dielectric layer within the opening and over the sacrificial layer;
   forming an opening through the second dielectric layer and the sacrificial layer to expose a portion of the source/drain junction and remove remaining portions of the sacrificial layer from under the second dielectric layer; and
   depositing a metal layer beneath the second dielectric layer and directly over the source/drain junction.

2. The method of claim 1, wherein the semiconductor substrate comprises a semiconductor fin and the source/drain junction is formed over a source/drain region of the fin.

3. The method of claim 1, further comprising forming sidewall spacers within the opening prior to depositing the sacrificial layer.

4. The method of claim 1, wherein the source/drain junction is formed by selective epitaxy.

5. The method of claim 1, wherein the second dielectric layer is formed at a temperature of less than 300° C.

6. The method of claim 1, further comprising annealing to react the metal layer with the source/drain junction and form a metal semiconductor alloy contact that extends over the source/drain junction and at least partially under the second dielectric layer.

7. The method of claim 6, wherein the metal semiconductor alloy layer contacts a sidewall spacer layer disposed over a sidewall of the opening.

8. The method of claim 6, wherein the metal semiconductor alloy layer is laterally displaced by an air gap from a sidewall spacer layer disposed over a sidewall of the opening.

9. The method of claim 1, further comprising depositing a conductive fill layer within the opening and directly over the metal layer.

10. The method of claim 9, wherein a width of the metal layer is substantially equal to a width of the opening and a width of the conductive fill layer is less than the width of the opening.

* * * * *